United States Patent
Kim et al.

(10) Patent No.: US 8,049,545 B2
(45) Date of Patent: Nov. 1, 2011

(54) DELAY-LOCKED LOOP CIRCUIT CONTROLLED BY COLUMN STROBE WRITE LATENCY

(75) Inventors: Yang-ki Kim, Seoul (KR); Seok-hun Hyun, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/644,044

(22) Filed: Dec. 22, 2009

(65) Prior Publication Data

US 2010/0156488 A1    Jun. 24, 2010

(30) Foreign Application Priority Data

Dec. 22, 2008 (KR) .................. 10-2008-0131192

(51) Int. Cl.
*H03L 7/06* (2006.01)
(52) U.S. Cl. ......................... 327/158; 327/149
(58) Field of Classification Search .................. 327/149, 327/158
See application file for complete search history.

(56) References Cited

U.S. PATENT DOCUMENTS

| 7,551,012 | B2* | 6/2009 | Mai et al. | 327/158 |
| 7,786,752 | B2* | 8/2010 | Oh et al. | 326/30 |
| 2008/0169851 | A1* | 7/2008 | Liu | 327/158 |
| 2009/0033388 | A1* | 2/2009 | Heragu et al. | 327/158 |
| 2009/0267663 | A1* | 10/2009 | Varricchione | 327/158 |
| 2010/0213992 | A1* | 8/2010 | Hyun et al. | 327/147 |
| 2011/0058433 | A1* | 3/2011 | Choi et al. | 365/194 |

FOREIGN PATENT DOCUMENTS

| JP | 08-180676 | 7/1996 |
| KR | 1020040021478 A | 3/2004 |
| KR | 100732766 B1 | 6/2007 |

* cited by examiner

*Primary Examiner* — Lincoln Donovan
*Assistant Examiner* — Adam Houston
(74) *Attorney, Agent, or Firm* — Volentine & Whitt, PLLC

(57) ABSTRACT

The DLL circuit includes a control circuit which controls bias currents of the unit delay circuits according to an externally input column address strobe writing latency (CWL) signal, and/or a DCC control circuit which adjusts steps of a DCC current of the DCC according to the externally input column address strobe writing latency (CWL) signal. The CWL signal may be input by a semiconductor memory device and may be indicative of a column address strobe writing latency of the semiconductor memory device. The semiconductor memory device may be a double data rate (DDR) synchronous DRAM (SDRAM) device.

5 Claims, 5 Drawing Sheets delay line, a phase detector, a control unit and a control circuit. The delay line includes a plurality of series connected unit delay circuits and delays an external clock signal in response to a control signal. The phase detector detects a phase difference between a signal output by the delay line and the external clock signal. The control unit generates the control signal in response to signals output by the phase detector. The control circuit which controls bias currents of the unit delay circuits according to an externally input column address strobe writing latency (CWL) signal.

According to another aspect of the inventive concepts, a delay locked loop (DLL) circuit is provided which includes a delay line, a phase interpolator, a duty cycle corrector (DCC), a phase detector, a control unit, and a DCC control circuit. The delay line includes a plurality of series connected unit delay circuits and delays an external clock signal in response to a control signal. The phase interpolator executes phase interpolation with respect to two signals output by the delay line. The duty DCC corrects duty cycles of signals output by the phase interpolator. The phase detector detects a phase difference between a signal output by the DCC and the external clock signal. The control unit generates the control signal in response to signals output by the phase detector. The DCC control circuit adjusts steps of a duty cycle correcting (DCC) current of the DCC according to an externally input column address strobe writing latency (CWL) signal.

According to another aspect of the inventive concepts, a delay locked loop (DLL) is provided which includes a delay line, a phase interpolator, a duty cycle corrector (DCC), a phase detector, a control unit, a control circuit, and a DCC control circuit. The delay line includes a plurality of series connected unit delay circuits and delays an external clock signal in response to a control signal. The phase interpolator executes phase interpolation with respect to two signals output by the delay line. The duty DCC corrects duty cycles of signals output by the phase interpolator. The phase detector detects a phase difference between a signal output by the DCC and the external clock signal. The control voltage generating circuit generates the control signal in response to signals output by the phase detector. The control circuit controls bias currents of the unit delay circuits according to an externally input column address strobe writing latency (CWL) signal. The DCC control circuit adjusts steps of a DCC current of the DCC according to the externally input CWL signal.

DELAY-LOCKED LOOP CIRCUIT CONTROLLED BY COLUMN STROBE WRITE LATENCY

CROSS-REFERENCE TO RELATED APPLICATIONS

A claim of priority is made to Korean Patent Application No. 10-2008-0131192, filed Dec. 22, 2008, in the Korean Intellectual Property Office, the disclosure of which is incorporated herein in its entirety by reference.

BACKGROUND

The inventive concepts described herein generally relate to semiconductor devices, and more particularly, to delay-locked loop (DLL) circuits which may be used, for example, in synchronous memory devices.

In certain types of semiconductor memory devices, such as Rambus DRAM (RDRAM) devices and synchronous DRAM (SDRAM) devices, a DLL circuit may operate in synchronization with reference clock signals, that is, external clock signals. The DLL circuit receives the external clock signals and generates internal clock signals which are delayed for a predetermined time period, where the internal clock signals are used as clock signals by components of a semiconductor memory device.

A DLL circuit is generally worst-case designed so that it is operational at the highest possible operating frequency of the semiconductor memory device. This can result in current consumption inefficiencies at lower operating speeds, as well as deterioration of duty cycle correction characteristics at lower operation speeds.

SUMMARY

According to an aspect of the inventive concepts, a delay locked loop (DLL) circuit is provided which includes a delay line, a phase detector, a control unit and a control circuit. The delay line includes a plurality of series connected unit delay circuits and delays an external clock signal in response to a control signal. The phase detector detects a phase difference between a signal output by the delay line and the external clock signal. The control unit generates the control signal in response to signals output by the phase detector. The control circuit which controls bias currents of the unit delay circuits according to an externally input column address strobe writing latency (CWL) signal.

BRIEF DESCRIPTION OF THE DRAWINGS

Exemplary embodiments of the inventive concepts will be more clearly understood from the detailed description that follows, taken in conjunction with the accompanying drawings, in which.

DETAILED DESCRIPTION OF THE EMBODIMENTS

Figure 1:
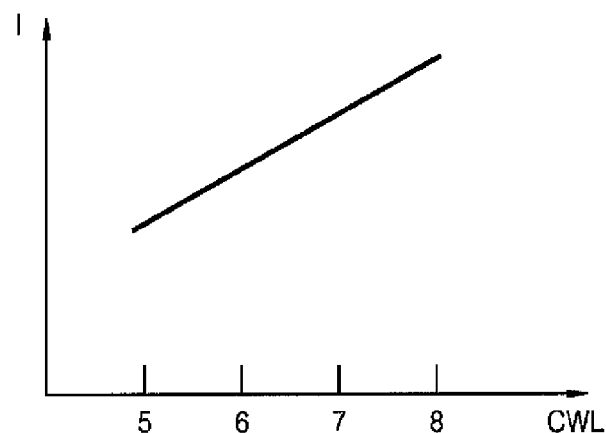
FIG. 1 is a graph showing a relationship between consumed current I and a column address strobe writing latency (CWL)

Hereinafter, the inventive concepts will be described in detail by explaining exemplary embodiments of the invention with reference to the attached drawings. Like reference numerals in the drawings denote like elements.

Table 1 shows operating speed ranges of a double data rate (DDR) synchronous DRAM (SDRAM) at different column address strobe write latencies (CWLs). The operating speeds are shown as the period (ns) of an operating clock tCK.

TABLE 1

| CWL | Operating Speed (tCK) |
|---|---|
| 5 | tCK ≧ 2.5 ns |
| 6 | 2.5 ns > tCK ≧ 1.875 ns |
| 7 | 1.875 ns > tCK ≧ 1.5 ns |
| 8 | 1.5 ns > tCK ≧ 1.25 ns |

As shown, the operating speeds are dependent upon the CWL in a DDR SDRAM. For example, if the CWL is 5, the period of the operating clock tCK should be 2.5 ns or more. On the other hand, if the CWL is 8, the period of the operating clock tCK should be from 1.25 ns to 1.5 ns. In other words, a DDR SDRAM exhibits a slower operating speed as a value of CWL is reduced, and a faster operating speed as a value of the CWL is increased.

According to one or more of the inventive concepts described herein, the current consumed by a DLL circuit is reduced by controlling current flowing in the DLL circuit according to the CWL. This is explained in greater detail below.

Generally, current consumption with respect to operating speed may be represented by Equation 1.

$$f \propto I^{(1/2)} \quad \text{Equation 1}$$

In Equation 1, f denotes the operational clock frequency of a given analog circuit, e.g. an analog DLL circuit, and I denotes consumed current of the given analog circuit.

As mentioned previously, the operating speed of a DDR SDRAM is dependent upon the CWL. Thus, by combining this factor with Equation 1, the relative current consumption of a DLL circuit according to the CWL may be determined as illustrated in FIG. 1 and as shown in Table 2 below. In other words, when it is assumed that consumed current is 1 when the CWL is 8, consumed current is approximately 0.71 when the CWL is 5, and thus consumed current may be reduced by maximum 29%.

TABLE 2

| CWL | Operating Speed (tCK) | Consumed Current (normalized at CWL is 8) | Reduction Rate with respect to a case where CWL is 8 |
|---|---|---|---|
| 5 | tCK ≧ 2.5 ns | 0.71 | 29% |
| 6 | 2.5 ns > tCK ≧ 1.875 ns | 0.82 | 18% |
| 7 | 1.875 ns > tCK ≧ 1.5 ns | 0.91 | 9% |
| 8 | 1.5 ns > tCK ≧ 1.25 ns | 1 | 0 |

Figure 2:
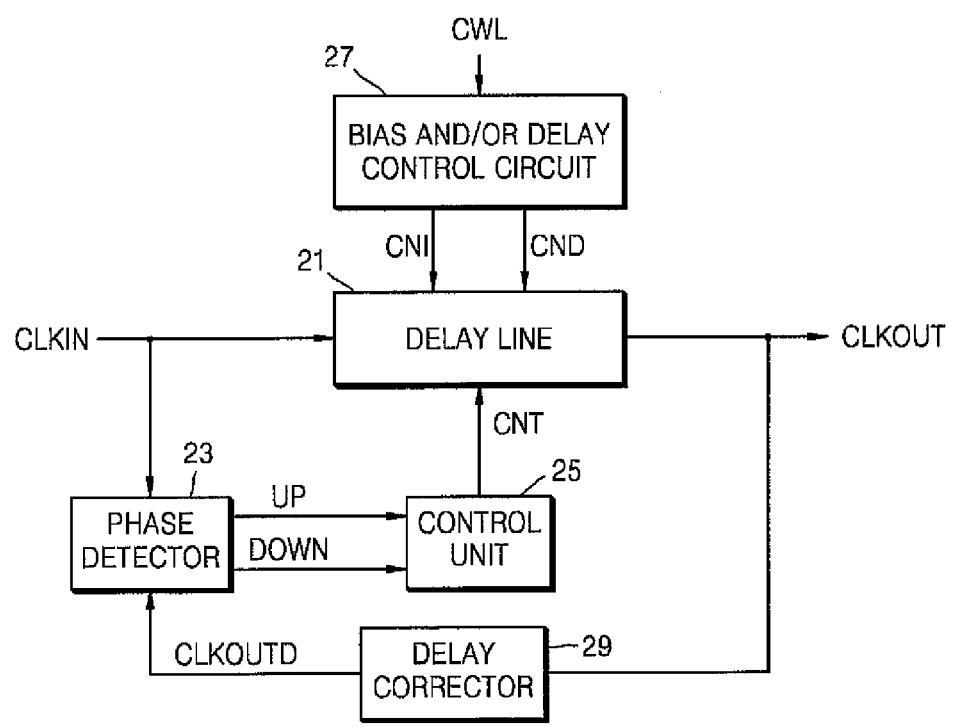
FIG. 2 is a diagram of a delay locked loop (DLL) circuit according to an embodiment of the inventive concepts.

FIG. 2 is a diagram of a DLL circuit according to an embodiment of the inventive concepts. As described below, the DLL circuit of this example is operationally responsive to the value of the CWL.

Referring to FIG. 2, the DLL circuit includes a delay line 21, a phase detector 23, a control unit 25, and a bias and/or delay control circuit 27. Also, as shown, the DLL circuit may further include a delay corrector 29.

The delay line 21 includes, for example, a plurality of unit delays that are connected in series. The delay line 21 is functional to delay an operating clock signal, that is, an externally applied external clock signal CLKIN, in response to a control signal CNT, and to output a corresponding delayed operating clock signal as an internal clock signal CLKOUT. The delay line 21 may, for example, be a voltage controlled delay line (VCDL) or a fixed delay line.

The phase detector 23 detects the phase difference between the internal clock signal CLKOUT output by the delay line 21 and an external clock signal CLKIN. Alternatively, in case where the DLL circuit includes the delay corrector 29, the delay corrector 29 delays the internal clock signal CLKOUT output by the delay line 21 by a predetermined time period and outputs a corresponding delayed internal clock signal CLKOUT as a signal CLKOUTD, and the phase detector 23 detects the phase difference between the signal CLKOUTD output by the delay corrector 29 and the external clock signal CLKIN. In either case, the phase detector 23 generates a signal UP or a signal DOWN depending on the detected phase difference.

The control unit 25 generates the control signal CNT in response to signals UP and DOWN output by the phase detector 23. As mentioned above, the control signal CNT controls the delay line 21.

In the example of this embodiment, the bias and/or delay control circuit 27 is configured to control bias currents of the unit delay circuits in the delay line 21 according to the CWL of a DDR SDRAM operatively associated with the DLL circuit. In particular, the bias and/or delay control circuit 27 is configured to reduce bias currents of the unit delay circuits in the delay line 21 when the CWL decreases, that is, when the operating speed of the DDR SDRAM decreases. As a result, current consumed by the unit delay circuits in the delay line 21 is reduced when the DDR SDRAM operates at a low operating speed, and thus, the overall current consumption of the DLL circuit is reduced.

In addition, in the example of this embodiment, the bias and/or delay control circuit 27 is configured to control delay times of the unit delay circuits in the delay line 21 according to the CWL of the DDR SDRAM. In particular, the bias and/or delay control circuit 27 is configured to increase delay times of the unit delay circuits in the delay line 21 in the case where the CWL decreases, that is, the operating speed of the DDR SDRAM decreases. Thus, when the CWL decreases, that is, the operating speed of the DDR SDRAM decreases, the overall delay time of the delay line 21 may be maintained constant with a smaller number of unit delay circuits. Therefore, in case where the CWL decreases, that is, the operating speed of the DDR SDRAM decreases, the number of utilized unit delay circuits may be reduced, and thus current consumption may be reduced.

The bias and/or delay control circuit 27 generates either or both of a bias current control signal CNI and a delay control signal CND. That is, the bias and/or delay control circuit 27 may be configured to control either or both of bias currents and delay times of the unit delay circuits in the delay line 21 according to the CWL as described above. If both the bias current control signal CNI and the delay control signal CND are activated, both the bias currents and the delay times of the unit delay circuits in the delay line 21 are controlled. If only the bias current control signal CNI is activated, only the bias currents of the unit delay circuits in the delay line 21 are controlled. If only the delay control signal CND is activated, only the delay times of the unit delay circuits in the delay line 21 are controlled.

Figure 3:
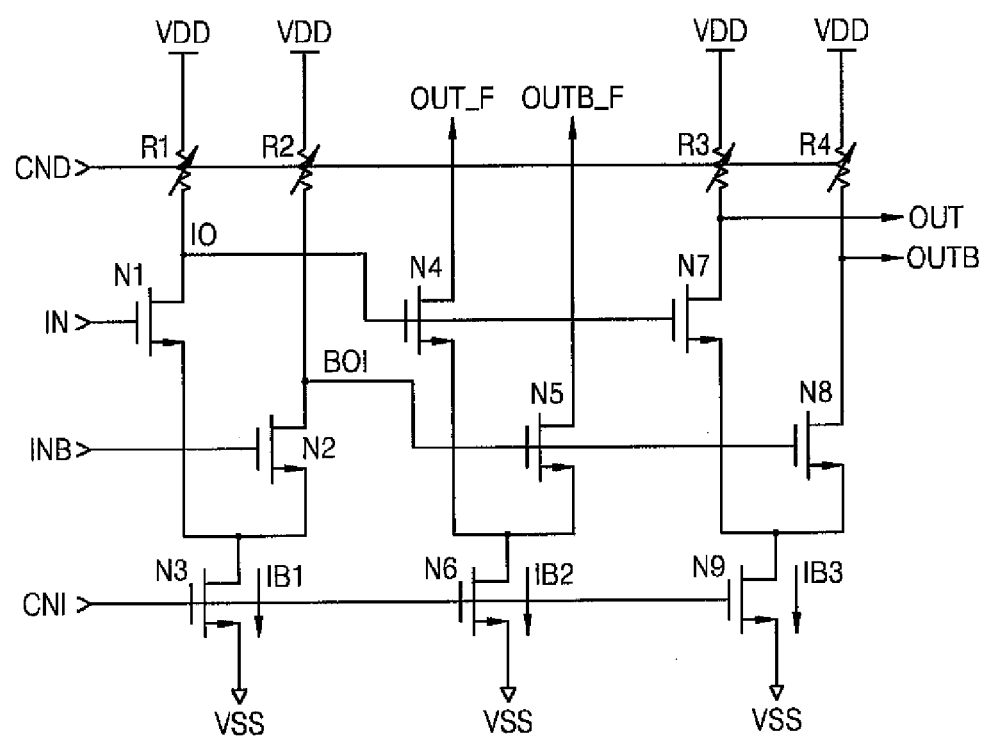
FIG. 3 is a circuit diagram of a unit delay included in a delay line of FIG. 2, according to an embodiment of the inventive concepts.

FIG. 3 is a circuit diagram illustrating an example of a unit delay circuit in the delay line 21 shown in FIG. 2, according to an embodiment of the inventive concepts.

Referring to FIG. 3, the unit delay circuits includes a first pair of differential transistors N1 and N2, a first pair of variable resistors R1 and R2, a first bias transistor N3, a second pair of differential transistors N4 and N5, a second bias transistor N6, a third pair of differential transistors N7 and N8, a second pair of variable resistors R3 and R4, and a third bias transistor N9.

The differential transistors N1 and N2 are gated to an input signal IN and a complementary input signal INB, respectively. The variable resistors R1 and R2 are interconnected between first terminals of the differential transistors N1 and N2 and a power voltage VDD, respectively, and the resistances of the variable resistors R1 and R2 are adjustable in response to a delay control signal CND generated by the bias and/or delay control circuit 27 shown in FIG. 2. Each of the variable resistors R1 and R2 may, for example, be formed of transistors that are connected to each other in parallel, and delay control signals CND as digital signals may, for example, be applied to gates of the transistors.

A first terminal of the first bias transistor N3 is connected to second terminals of the first pair of differential transistors N1 and N2, and a second terminal of the first bias transistor N3 is connected to a ground voltage VSS. A bias current control signal CNI generated by the bias and/or delay control circuit 27 is applied to a gate of the first bias transistor N3.

The differential transistors N4 and N5 are gated to receive an internal output signal IO and a complementary internal output signal IOB, which are respectively output by the first terminals of the differential transistors N1 and N2, respectively. A first terminal of the second bias transistor N6 is connected to second terminals of the differential transistors N4 and N5, and a second terminal of the second bias transistor N6 is connected to the ground voltage VSS. The bias current control signal CNI is applied to a gate of the second bias transistor N6.

The differential transistors N7 and N8 are also gated to receive the internal output signal IO and the complementary internal output signal IOB, respectively. The variable resistors R3 and R4 are interconnected between first terminals of the differential transistors N7 and N8 and the power voltage VDD, respectively, and the resistances of the variable resistors R3 and R4 are adjustable in response to the delay control signal CND. Each of the variable resistors R3 and R4 may, for example, be formed of transistors that are connected to each other in parallel, and the delay control signals CND as digital signals may, for example, be applied to gates of the transistors.

A first terminal of the third bias transistor N9 is connected to second terminals of the differential transistors N7 and N8, and a second terminal of the third bias transistor N9 is connected to the ground voltage VSS. The bias current control signal CNI is applied to a gate of the third bias transistor N9. An output signal OUT and a complementary output signal OUTB are output by the first terminals of the differential transistors N7 and N8, respectively.

In operation, the voltage level of the bias current control signal CNI is adjusted by the bias and/or delay control circuit 27 according to the CWL of a DDR SDRAM.

For example, the bias and/or delay control circuit 27 may be configured as a current mirror together with the first through third bias transistors N3, N6, and N9. As a result, when the voltage level of the bias current control signal CNI is adjusted, a bias current IB1 via the first bias transistor N3, a bias current IB2 via the second bias transistor N6, and a bias current IB3 via the third bias transistor N9 are adjusted according to the adjusted voltage level of the bias current control signal CNI.

For example, in the case where the CWL decreases, that is, the operating speed of the DDR SDRAM decreases, the bias and/or delay control circuit 27 may lower the voltage level of the bias current control signal CNI, and thus the bias currents IB1, IB2, and IB3 decrease.

In addition, the delay control signal CND may, for example, be generated in the form of a digital code (signal) that is adjusted according to the CWL of the DDR SDRAM and that controls resistances of the variable resistors R1 and R2 and the variable resistors R3 and R4. In this manner, the delay time of the unit delay shown in FIG. 3 may be adjusted. In particular, in the case where the CWL decreases, that is, the operating speed of the DDR SDRAM decreases, a digital code (CND) may be generated which causes the resistances of the variable resistors R1 and R2 and the variable resistors R3 and R4 to increase, and thus the delay time of the unit delay circuit shown in FIG. 3 is made to increase.

Figure 4:
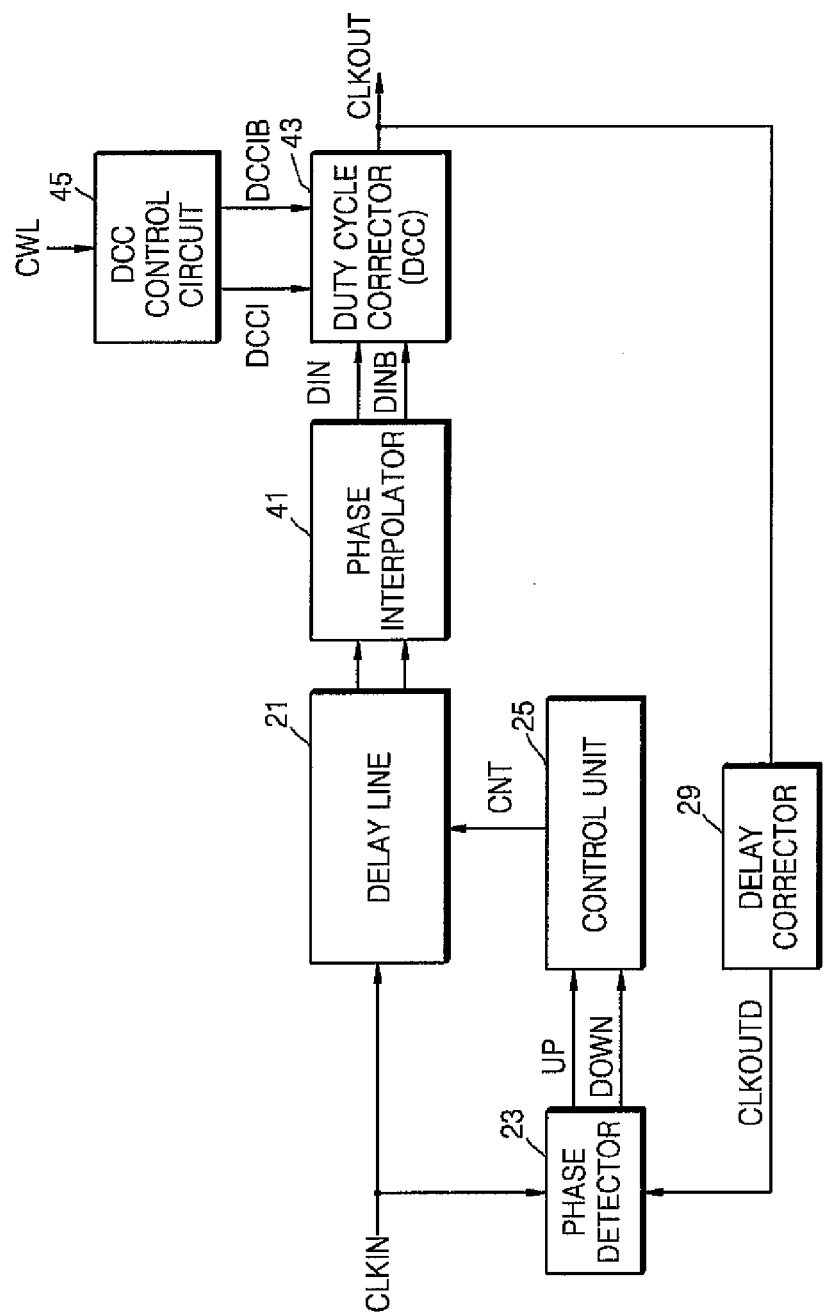
FIG. 4 is a DLL circuit according to another embodiment of the inventive concepts.

FIG. 4 is a circuit diagram of a DLL circuit according to another embodiment corresponding to one or more of the inventive concepts described herein.

Referring to FIG. 4, the DLL circuit of this example is configured to be controlled by the CWL of a DDR SDRAM, and includes the delay line 21, the phase detector 23, the control unit 25, a phase interpolator 41, a duty cycle corrector (DCC) 43, and a DCC control circuit 45. As illustrated in FIG. 4, the DLL circuit according to the present embodiment may further include the delay corrector 29, if desired.

The delay line 21, the phase detector 23, the control unit 25, and the delay corrector 29 shown in FIG. 4 are the same to those shown in previously described FIG. 2, and thus a detailed description thereof is omitted here to avoid redundancy.

The phase interpolator 41 and the DCC 43 are components for correcting duty cycles of signals output by the delay line 21. In particular, the phase interpolator 41 performs phase interpolation to two signals output by the delay line 21, and the DCC 43 corrects duty cycles of signals DIN and DINB that are output by the phase interpolator 41, and outputs an internal clock signal CLKOUT with a corrected duty cycle.

The DCC control circuit 45 is configured to adjust steps of DCC current DCCI of the DCC 43 according to the CWL of a DDR SDRAM. In particular, the DCC control circuit 45 is configured to reduce steps of DCC current DCCI in the case where the CWL increases, that is, the operating speed of the DDR SDRAM increases.

As a result, steps of DCC current DCCI become smaller in a faster operating speed of the DDR SDRAM. Therefore, changes in duty, which occurs by one step of DCC current DCCI, become smaller. Thus, variations in duty are relatively small even at a fast operating speed of the DDR SDRAM, and a duty cycle correcting characteristics may be improved.

Figure 5:
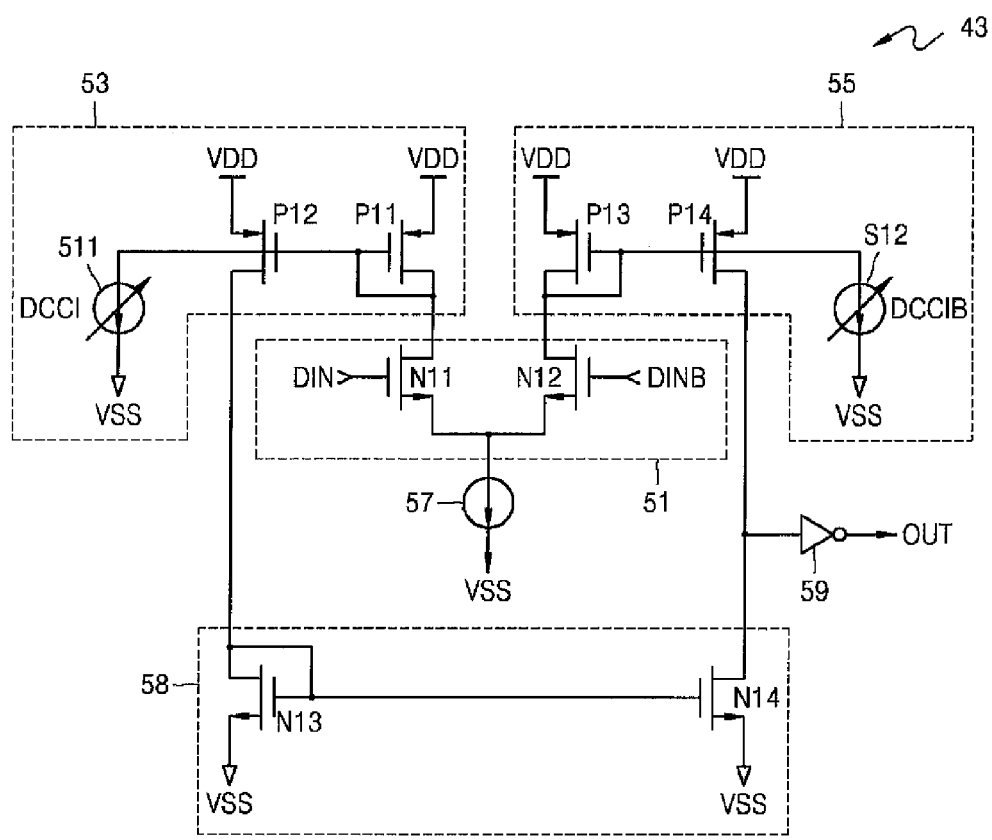
FIG. 5 is a circuit diagram of a duty cycle corrector (DCC) shown in FIG. 4, according to an embodiment of the inventive concepts.

FIG. 5 is a circuit diagram of the DCC 43 shown in FIG. 4, according to an embodiment of the one or more inventive concepts described herein.

Referring to FIG. 5, the DCC 43 includes a pair 51 of differential transistors N11 and N12, a first current mirror 53, a second current mirror 55, a current source 57, a third current mirror 58, and an inverter 59.

The differential transistors N11 and N12 are gated to receive a signal DIN and a complementary output signal DINB that are output by the phase interpolator 41 shown in FIG. 4, respectively. The first current mirror 53 is connected to a terminal of one of the differential transistors N11 and N12, that is, a first terminal of the differential transistor N11, and supplies DCC current DCCI thereto. The second current mirror 55 is connected to the other terminal of the other one of the differential transistors N11 and N12, that is, a first terminal of the differential transistor N12, and supplies complementary DCC current DCCIB thereto.

The DCC current DCCI and the complementary DCC current DCCIB are generated by the DCC control circuit 45 shown in FIG. 4 and are supplied to the DCC 43, and the DCC current DCCI and the complementary DCC current DCCIB are adjusted according to the CWL of a DDR SDRAM. In particular, in the case where the CWL increases, that is, the operating speed of a DDR SDRAM increases, the steps of the DCC current DCCI and the complementary DCC current DCCIB decrease.

The current source 57 is interconnected between a common connection node of the differential transistors N11 and N12 and the ground voltage VSS. A first terminal of the third current mirror 58 is connected to the first current mirror 53, and a second terminal of the third current mirror 58 is connected to the second current mirror 55. The inverter 59 generates an output signal OUT by inverting a signal of a connection node of the second current mirror 55 and the third current mirror 58.

The first current mirror 53 includes a PMOS transistor P11, a PMOS transistor P12, and a current source S11. The PMOS transistor P11 has a source connected to the power voltage VDD, and a drain and a gate connected to the first terminal of one of the differential transistors N11 and N12 (in this example, the first terminal of the differential transistor N11). The PMOS transistor P12 has a source is connected to the power voltage VDD, a drain connected to the first terminal of the third current mirror 58, and a gate connected to the gate of the PMOS transistor P11. The current source S11 provides DCC current DCCI to the gate of the PMOS transistor P12.

The second current mirror 55 includes a PMOS transistor P13, a PMOS transistor P14, and a current source S12. The PMOS transistor P13 has a source connected to the power voltage VDD and a drain and a gate connected to the first terminal of the other one of the differential transistors N11 and N12 (in this example, the first terminal of the differential transistor N12). The PMOS transistor P14 has a source connected to the power voltage VDD, and a drain connected to the second terminal of the third current mirror 58, and a gate connected to the gate of the PMOS transistor P13. The current source S12 provides complementary DCC current DCCI to the gate of the PMOS transistor P14.

The third current mirror 58 includes an NMOS transistor N13 and an NMOS transistor N14. The NMOS transistor N13 has a drain and a gate connected to the first current mirror 53 and a source connected to the ground voltage VSS. The NMOS transistor N14 has a drain connected to the second current mirror 55, a gate connected to the gate of the NMOS transistor N13, and a source connected to the power voltage VSS.

In operation, the duty of an output signal OUT output by the DCC 43 varies according to DCC current DCCI and complementary DCC current DCCIB. For the duty cycle correction of a same duty error at a lower operating frequency, more input differential signals DIN and DINB should be generated, thus requiring more current. However, when a DLL circuit is used in a SDRAM, the duty cycle correction is digitally controlled. Thus, current required for duty cycle correction, that is, DCC current DCCI is determined according to digital control. Generally, the steps of DCC current DCCI are determined in advance to guarantee low-speed operations of the DLL circuit (operations at a low operating frequency).

However, in case of high-speed operations of the DLL circuit, less input differential signals DIN and DINB are required with respect to a same duty error as that at a low operating speed. Thus, if the steps of DCC current DCCI are fixed, the duty of output signals OUT changes more significantly at a high operating speed as compared to that at a low operating speed.

Therefore, according to the present embodiment, the steps of DCC current DCCI are adjusted by the DCC control circuit 45 according to operating speeds of the DLL circuit, that is, the CWL of a DDR SDRAM. In particular, when operating speeds of the DLL circuit increase, that is, the CWL increases, the DCC control circuit 45 decreases the steps of DCC current DCCI. Accordingly, the steps of DCC current DCCI decrease at a high operating speed of the DLL circuit, and variations in duty cycle of an output signal OUT, which occurs by one step of DCC current DCCI, also decrease. Thus, variations in duty cycle are relatively small even at a fast operating speed, and a duty cycle correcting characteristic may be improved.

Figure 6:
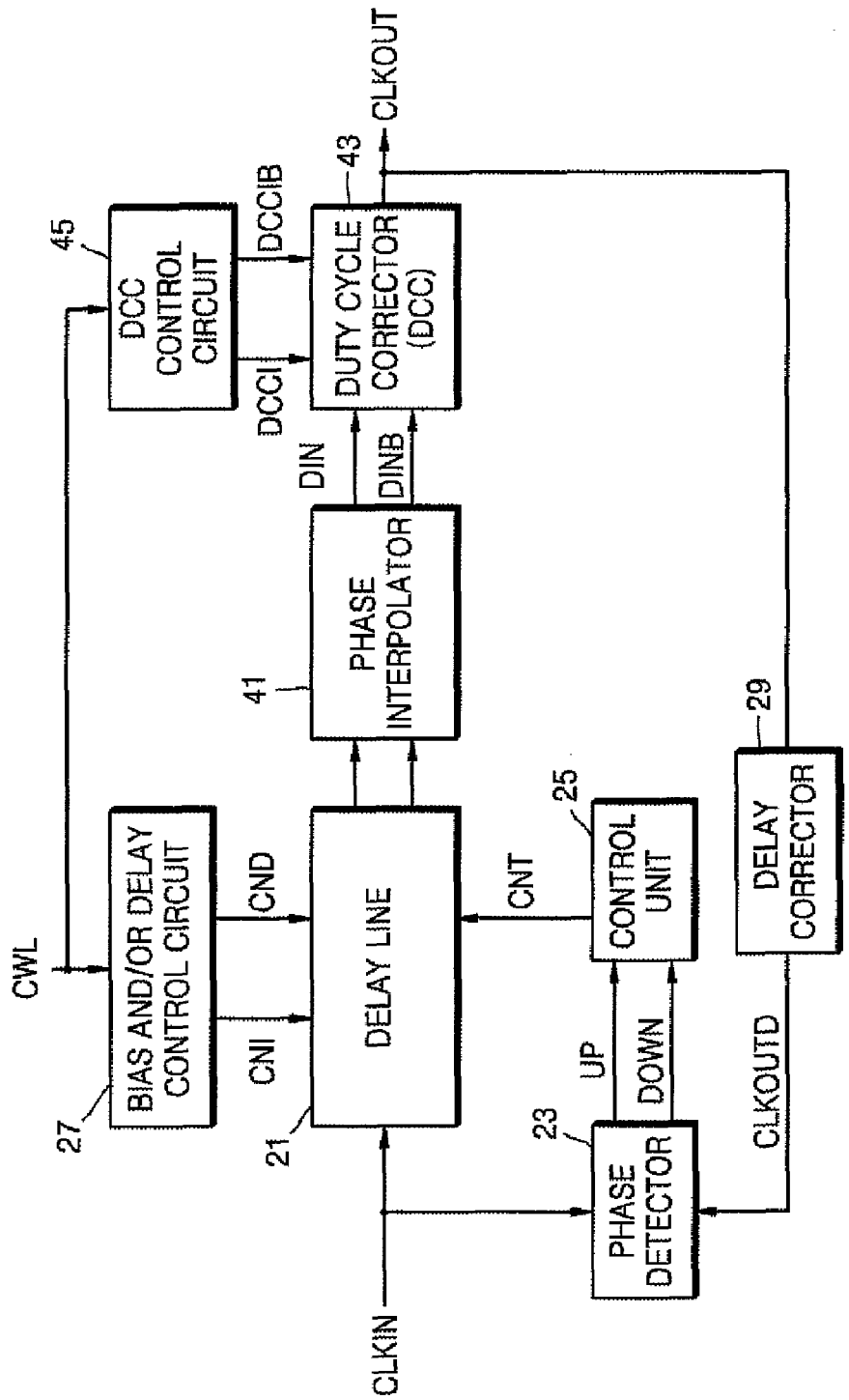
FIG. 6 is a diagram of a DLL circuit according to another embodiment of the inventive concepts.

FIG. 6 is a diagram of a DLL circuit according to another embodiment corresponding to one or more of the inventive concepts described herein.

Referring to FIG. 6, the DLL circuit of this embodiment is configured to be controlled by according to the CWL, and includes the delay line 21, the phase detector 23, the control unit 25, the bias and/or delay control circuit 27, the phase interpolator 41, the DCC 43, and the DCC control circuit 45. Also, as shown, the DLL circuit may further include the delay corrector 29, if desired.

The DLL circuit shown in FIG. 6 represents a combination of features of the DLL circuit according to the embodiment shown in FIG. 2 and the DLL circuit according to the embodiment shown in FIG. 4.

In the example of FIG. 6, the delay line 21, the phase detector 23, the control unit 25, and the delay corrector 29 shown in FIG. 6 are the same to those shown in previously described FIGS. 2 and 4. In addition, the bias and/or delay control circuit 27 shown in FIG. 6 is the same as that shown in FIG. 2. Finally, the phase interpolator 41, the DCC 43, and the DCC control circuit 45 shown in FIG. 6 are the same as those shown in FIG. 4. Each of the components shown in FIG. 6 has been described previously in connection with FIGS. 2 and 4, and accordingly, a detailed functional description thereof is omitted here to avoid redundancy.

It should be readily apparent that the DLL circuit according to the embodiment of FIG. 6 provides the effects of both the DLL circuit according to the embodiment shown in FIG. 2 and the DLL circuit according to the embodiment shown in FIG. 4. In other words, the DLL circuit of FIG. 6 may reduce current consumption at a low operating speed, and may improve duty cycle correction characteristics at a high operating speed.

While the inventive concepts have been described with reference to exemplary embodiments thereof, it will be understood that various changes in form and details may be made therein without departing from the spirit and scope of the following claims.

What is claimed is:

1. A delay locked loop (DLL) circuit comprising:
   a delay line which includes a plurality of series connected unit delay circuits and which delays an external clock signal in response to a control signal;
   a phase detector which detects a phase difference between a signal output by the delay line and the external clock signal;
   a control unit which generates the control signal in response to signals output by the phase detector; and
   a control circuit which controls bias currents and delay times of the unit delay circuits according to an externally input column address strobe writing latency (CWL) signal, wherein the control circuit generates a delay control signal and a bias control signal according to the CWL signal, and each of the unit delay circuits comprises:
   a first pair of differential transistors which are respectively controlled by an input signal and a complementary input signal;
   a first pair of variable resistors interconnected between a power voltage and respective first terminals of the first pair of differential transistors, wherein respective resistances of the first pair of variable resistors are set according to the delay control signal generated by the control circuit;
   a first bias transistor including a first terminal is connected to second terminals of the first pair of differential transistors and a second terminal is connected to a ground voltage, wherein the first bias transistor is controlled by the bias current control signal generated by the control circuit;
   a second pair of variable transistors which are respectively controlled by an internal output signal and a complementary internal output signal that are respectively output by the first terminals of the first pair of differential transistors;

a second bias transistor including a first terminal connected to second terminals of the second pair of differential transistors and a second terminal connected to the ground voltage, wherein the second bias transistor is controlled by the bias current control signal generated by the control circuit;

a third pair of differential transistors which are respectively controlled by the internal output signal and the complementary internal output signal;

a second pair of variable resistors interconnected between the power voltage and respective first terminals of the third pair of differential transistors, wherein respective resistances of the second pair of variable resistors are set according to the delay control signal generated by the control circuit; and a third bias transistor including a first terminal connected to second terminals of the third pair of differential transistors and a second terminal connected to the ground voltage, wherein the third bias transistor is controlled by the bias current control signal generated by the control circuit.

2. The DLL circuit of claim 1, wherein the control circuit reduces bias currents of the unit delay circuits when a CWL value indicated by the CWL signal decreases.

3. The DLL circuit of claim 1, wherein the control circuit increases delay times of the unit delay circuits when a CWL value indicated by the CWL signal decreases.

4. The DLL circuit of claim 1, wherein the CWL signal is input by a semiconductor memory device and is indicative of a column address strobe writing latency of the semiconductor memory device.

5. The DLL circuit of claim 4, wherein the semiconductor memory device is a double data rate (DDR) synchronous DRAM (SDRAM) device.

* * * * *